United States Patent [19]

Yamada et al.

[11] Patent Number: 5,306,948
[45] Date of Patent: Apr. 26, 1994

[54] SEMICONDUCTOR DEVICE AND SEMICONDUCTOR MODULE HAVING AUXILIARY HIGH POWER SUPPLYING TERMINALS

[75] Inventors: Takeo Yamada, Boston, Mass.; Satoru Isomura; Atsushi Shimizu, both of Ohme; Yuko Ito, Hamura; Tohru Kobayashi, Iruma; Mikinori Kawaji, Hino, all of Japan

[73] Assignee: Hitachi, Ltd., Tokyo, Japan

[21] Appl. No.: 950,332

[22] Filed: Sep. 24, 1992

[30] Foreign Application Priority Data

Oct. 3, 1991 [JP] Japan .................. 3-256356

[51] Int. Cl.⁵ .................. H01L 23/02; H01L 23/12
[52] U.S. Cl. .................. 257/690; 257/691; 257/693; 361/767; 361/772
[58] Field of Search .................. 257/690, 691, 692, 693, 257/697; 361/403, 404

[56] References Cited

U.S. PATENT DOCUMENTS

| | | | |
|---|---|---|---|
| 3,815,077 | 7/1974 | Anhalt et al. | 257/693 |
| 4,037,270 | 7/1977 | Ahmann et al. | 257/693 |
| 4,458,917 | 7/1984 | Yanagisawa et al. | 257/697 |
| 4,530,002 | 7/1985 | Kanai | 257/697 |
| 4,635,093 | 1/1987 | Ross | 257/693 |
| 5,041,899 | 8/1991 | Oku et al. | 257/691 |

FOREIGN PATENT DOCUMENTS

| | | | |
|---|---|---|---|
| 0071926 | 6/1981 | Japan | 257/697 |
| 0155750 | 9/1982 | Japan | 257/697 |
| 63-310139 | 12/1988 | Japan . | |

*Primary Examiner*—Rolf Hille
*Assistant Examiner*—David Ostrowski
*Attorney, Agent, or Firm*—Pennie & Edmonds

[57] ABSTRACT

Herein disclosed is a chip-carrier type semiconductor device adopting the MCC structure, in which a semiconductor pellet is mounted on the surface of the base substrate and in which mounting terminals to be connected with external terminals of the semiconductor pellet are mounted on the rear surface of the base substrate. In order to effect a test such as screening easily and inexpensively even if the mounting terminals are multiplied or miniaturized, the chip-carrier type semiconductor device adopting the MCC structure is equipped on the side surfaces of the base substrate with auxiliary terminals to be electrically connected with a plurality of external terminals which are arrayed on an element formed main surface of the semiconductor pellet.

25 Claims, 8 Drawing Sheets

SEMICONDUCTOR DEVICE AND SEMICONDUCTOR MODULE HAVING AUXILIARY HIGH POWER SUPPLYING TERMINALS

BACKGROUND OF THE INVENTION

The present invention relates to a semiconductor technology and, more particularly, to both a semiconductor device suited for a screening to be performed for warranting the reliability of the device after shipped and a semiconductor module having a plurality of semiconductor devices sealed therein.

A chip-carrier type semiconductor device adopting the MCC (i.e., Micro Carrier for LSI Chip) structure is used as a sealed body for a semiconductor pellet having a high speed circuit system and has a high packaging density because of its small package size. This chip-carrier type semiconductor device adopting the MCC structure is constructed mainly of a base substrate, a sealing cap, and a semiconductor pellet sealed in a cavity formed by the former two.

The base substrate of the chip-carrier type semiconductor device adopting the MCC structure is formed of the so-called "multi-layered ceramic substrate", which is prepared by laminating a plurality of wired sheets of mullite ceramics. The side of the base substrate, on which the semiconductor pellet is mounted, is arranged on its surface with a plurality of terminals, which are electrically connected with the individual ones of a plurality of mounting terminals arranged on the rear surface of the base substrate. The wiring of the base substrate, the terminals of the surface and the mounting terminals of the rear surface are all made of a tungsten-metallized layer, for example. The electric connections between the wirings of the different layers, between the terminals and the wirings, and between the mounting terminals and the wirings are achieved through connection holes formed in the mullite ceramic sheets and through connection hole wirings formed in the connection holes.

The aforementioned semiconductor pellet is made of a substrate of single crystalline silicon, for example, and is arranged on its element forming face with any or several kinds of semiconductor elements such as bipolar transistors, MOSFETs, resistance elements or capacity elements. The semiconductor pellet is mounted on the surface of the base substrate by the face-down method, in which its element forming face faces the surface of the base substrate. This mounting is carried out by connecting a plurality of external terminals (or bonding pads) arrayed on the element forming face of the semiconductor pellet and the plurality of terminals on the surface of the base substrate electrically and mechanically through solder electrodes (e.g., projection electrodes or CCB electrodes).

The aforementioned sealing cap is made of aluminum nitride, for example, and is adhered through a sealing agent to the peripheral area of the surface of the base substrate.

A plurality of chip-carrier semiconductor devices adopting the MCC structure are mounted on a module substrate, in which a cooling system is mounted, and they are installed together in a super computer or a large-sized computer.

The chip-carrier semiconductor device adopting the MCC structure is screened after its packaging process and at an early stage before it is shipped to a customer, so that it may be screened out at that initial stage. In short, the screening is carried out with a view to exclude the defective products, which would go out of order while being used by the customer, in advance. The screening is generally carried out by testing the functions of a packaged semiconductor device at first to eliminate the defective products, by burning in the semiconductor device selected as acceptable, and by testing the function of the burned-in device to further eliminate the defective products. The semiconductor device thus selected is shipped to the customer. The "burn-in" is to accelerate a defect, which would arise while being used by the customer, by running the chip-carrier type semiconductor device under a more severe using condition (with a load) than the using condition of the customer. For the burn-in, a higher voltage than that used in an ordinary operation of bipolar transistors is applied to a semiconductor device which is equipped with a semiconductor pellet mounting a circuit system composed mainly of the bipolar transistors, for example.

This burn-in is carried out such that the chip-carrier type semiconductor device is mounted in a testing wiring board (as called the "baby board"). The testing wiring board used is the so-called "printed circuit board (i.e., PCB)" which is formed with lead wires on the surface of an epoxy resin substrate.

The mounting of the aforementioned semiconductor device on the testing wiring board is accomplished by tentatively attaching the individual ones of the plurality of mounting terminals on the rear surface of the base substrate of the chip-carrier type semiconductor device to the plurality of terminals arrayed in the central area of the surface of the testing wiring board. The tentative attaching is performed by means of solder to effect the electric and mechanical connections.

The testing wiring board is arranged in its peripheral area with a plurality of testing terminals which are connected through lead wirings with terminals connected with the mounting terminals of the semiconductor device adopting the MCC structure. Testing styluses (or probes) connected with a tester are brought into abutment against (or contact with) those testing terminals so that the electric characteristics of the semiconductor device at the initial stage are tested by the tester at the time of the burn-in or its end. All of the terminals in the central area of the testing wiring board, the lead wirings and the testing terminals are made of Cu or a laminated layer composed mainly of Cu, for example. The testing terminals are arrayed at a larger pitch than the array pitch of the terminals at the central area of the testing wiring board with a view to retaining a surplus for the area to abut against the testing styluses and the displacement of the abutting test styluses.

The testing wiring board has a number of mounting terminals all over the rear surface of the base substrate of the aforementioned semiconductor device and adopts a multi-layered wiring structure with a view to reducing the size itself of the testing wiring board. The testing wiring board adopting the multi-layered wiring structure is formed on at least its surface and back with lead wirings such that the lead wirings on the surface and the back are electrically connected with each other through both connection holes (or through holes) formed in the testing wiring board and connection hole wirings.

The testing wiring board of this kind is made of an epoxy resin as a mother material, and its manufacturing technology is established to some extent so that it is featured by an easy production and a low production cost. In other words, the burn-in using the testing wiring board can be accomplished at a reduced cost to drop the overall manufacture cost of the aforementioned semiconductor device.

Incidentally, the chip-carrier semiconductor device adopting the MCC structure is disclosed in Japanese Patent Laid-Open No. 310139/1988, for example.

SUMMARY OF THE INVENTION (1) The testing wiring board to be used in the aforementioned burn-in, especially the testing wiring board adopting the multi-layered wiring structure miniaturizes the more the individual working sizes of the terminals of the central area, the lead wirings, the testing terminals of the peripheral area and the connection holes for connecting the surface and the back as the mounting terminals of the chip-carrier type semiconductor device adopting the MCC structure becomes the more. The terminals of the testing wiring board, the lead wirings and the testing terminals are individually worked by using the photolithography technology and the etching technology. These individual photolithography and etching technologies progress with the high integration of the circuit system which is mounted on the semiconductor pellet of the chip-carrier semiconductor device adopting the MCC structure. As a result, the terminals of the aforementioned testing wiring board, the lead wirings and the testing terminals can individually cope with the miniaturization of the working sizes.

Since, however, the connection holes of the testing wiring board are bored by using drills, i.e., by the machining, there arises a limit to the reduction of the diameters of the drills. This makes it impossible to manufacture the testing wiring board having the multi-layered wiring structure which is formed with the connection holes having the miniature size, in a manner to correspond to the multiple mounting terminals of the chip-carrier semiconductor device adopting the MCC structure.

(2) In order to eliminate this difficulty, it is conceivable to adopt a multi-layered ceramic substrate as the testing wiring board. The multi-layered ceramic substrate is formed by forming connection holes in a ceramic sheet, by forming metallized wirings on the surface of the ceramic sheet and in the connection holes, and by laminating and sintering a plurality of such ceramic sheets. The connection holes to be formed in the ceramic sheets are punched out, likewise by the mechanical working, but can have a smaller machining size than the diameter of the aforementioned drills.

However, the multi-layered ceramic substrate requires a large number of manufacture steps including the step of individually forming the ceramic sheets having the connection holes and the metallized wirings and the step of laminating and sintering the plurality of ceramic sheets. As a result, the cost for manufacturing the testing wiring board rises with the resultant rise of the cost for manufacturing the chip-carrier type semiconductor device adopting the MCC structure.

Moreover, although the multi-layered ceramic substrate can miniature the machining size of the connection holes in the ceramic sheets, the punching in itself belongs to the machining so that the punching tools encounter a restriction on the miniaturization. In other words, the multi-layered ceramic substrate used as the testing wiring board will be unable before long to cope with the multiplication of the mounting terminals of the chip-carrier semiconductor device adopting the MCC structure.

The present invention has objects, as enumerated in the following:

(1) To provide a technology capable of testing or screening the mounting terminals of a semiconductor device, which has a semiconductor pellet mounted on the surface of a substrate and the mounting terminals to be connected with external terminals on the rear surface of the substrate, easily and inexpensively even if the mounting terminals are multiplied and miniaturized;

(2) In addition to the above-specified object (1), to provide a technology capable of multiplying the mounting terminals in the aforementioned semiconductor device independently of the test such as the screening;

(3) In addition to the above-specified object (2), to provide a technology capable of miniaturizing the aforementioned semiconductor device;

(4) In addition to the above-specified object (1), to provide a technology capable of either improving the reliability of the selection result of good and defective products or ensuring the selection in the test of screening the aforementioned semiconductor device;

(5) In addition to the above-specified object (1), to provide a technology capable of improving the workability in the test of screening the aforementioned semiconductor device;

(6) In addition to the above-specified object (1), to provide a technology capable of improving the performances of the aforementioned semiconductor device at the time of testing or screening it or at the time of the ordinary circuit operation of it;

(7) In addition to the above-specified object (6), to provide a technology capable of reducing the defects in the aforementioned semiconductor device; and (8) To provide a technology capable of testing or screening a plurality of semiconductor devices which are mounted on a module substrate of a semiconductor module and each of which has a semiconductor pellet mounted on the surface of a substrate and mounting terminals to be connected with the external mounting of the semiconductor pellet on the rear surface of the substrate.

The aforementioned and other objects and novel features of the present invention will become apparent from the following description to be described hereinafter with reference to the accompanying drawings.

The representatives of the invention to be disclosed herein will be briefly summarized in the following.

(1) In a semiconductor device in which a plurality of external terminals arrayed on an element forming face of a semiconductor pellet mounted on the surface of a base substrate are electrically connected with a plurality of mounting terminals arrayed on the rear surface opposite to the surface of the base substrate, this base substrate is formed on its side with either power supply terminals, which are electrically connected with power supply ones of a plurality of external terminals arrayed on the element forming face of the semiconductor pellet, or the power supply terminals and signal terminals which are electrically connected with signal external terminals. This semiconductor device belongs to the chip-carrier type, in which one or more semiconductor pellets are sealed up by a sealing cap on the surface of the base substrate.

(2) Either the power supply terminals formed on the side of the base substrate, as described in the foregoing means (1), or the power supply terminals and the signal terminals are made to have a larger size than that of the plurality of mounting terminals arrayed on the rear surface of the base substrate.

(3) In addition to the power supply terminals formed on the side of the base substrate, as described in the foregoing means (1) or (2), power supply terminals, which are made to have a larger area than that of the mounting terminals and electrically connected with the power supply terminals, are formed in the central area on the rear surface of the aforementioned base substrate.

(4) The base substrate, as described in any of the foregoing means (1) to (3), is constructed of a multi-layered ceramic substrate which is prepared by laminating and sintering a plurality of ceramic sheets having their surfaces formed with metallized layers of a refractory metal as power supply wirings or signal wirings, and the power supply wirings of the multi-layered ceramic substrate formed of the refractory metallized layer are constructed to have a mesh-shaped planar shape all over a predetermined internal wiring layer of the multi-layered ceramic substrate.

(5) The base substrate, as described in any of the foregoing means (1) to (4), is formed on its side with two power supply terminals to be individually fed with at least two kinds of power, and has mounted thereon a capacity element which has its one electrode electrically connected with one of the two power supply terminals and its other electrode connected with the other power supply terminal.

(6) The mounting terminals on the rear surface of the base substrate of the semiconductor device, as described in any of the foregoing means (1) to (5), and the terminals on the surface of the module substrate are electrically connected to constitute a module packaging device having a plurality of semiconductor devices mounted on the surface of the aforementioned module substrate.

According to the above-specified means (1), the following operational effects can be obtained:

(A) At the burn-in, when good and defective semiconductor devices are to be selected at an initial stage before they are shipped to customers after the packaging process, the circuit of the semiconductor pellet can be fed with either the power or the power and the signals through either the power supply terminals, which are formed on the side of the base substrate of the semiconductor device, or the power supply terminals and signal terminals (as will be called the "testing terminals"). As a result, it is possible to eliminate the testing wiring board (or the baby board) which might otherwise be necessary for the burn-in. Thanks to the elimination of that testing wiring board, it is basically possible to free the testing wiring board, which is made of a resin board, of the problem that the working of the connection holes between the upper and lower wirings has a limit and the testing wiring board, which is made of a multi-layered ceramic substrate, of the problem that the working and manufacture are complicated.

(B) Since the testing terminals are arranged on the rear surface of the base substrate of the aforementioned semiconductor device other than the rear surface of the same, a plurality of mounting terminals arrayed on the rear surface of the base substrate can be finely worked independently of those testing terminals. As a result, the mounting terminals of the semiconductor device can be multiplied.

(C) Since the plurality of mounting terminals are arrayed on the rear surface of the base substrate of the aforementioned semiconductor device, the number of arrays of the mounting terminals can be increased more than that of the case, in which they are arrayed on the side of the base substrate, so that the mounting terminals of the semiconductor device can be multiplied.

(D) Since the semiconductor pellet is mounted by the face-down method on the surface of the base substrate of the aforementioned semiconductor device, the size of the base substrate can be reduced, as compared with the case of the face-up method in which the wires are led out to the periphery of the semiconductor pellet, to an extent corresponding to the leading area of the wires, so that the semiconductor device can be miniaturized.

According to the above-specified means (2), when the test styluses are brought into abutment against (or contact with) the testing terminals at the burn-in of the aforementioned screening, surpluses are established for the area between the testing terminals and the testing styluses and for the displacement of the two so that the testing styluses can be reliably brought into abutment against the testing terminals thereby to enhance the reliability in selecting the good and defective products at the initial stage by the burn-in. Moreover, the abutment can be facilitated to improve the workability of the burn-in.

According to the above-specified means (3), at the burn-in of the aforementioned screening, the powers can be supplied from the individual central areas of the side and back of the base substrate and fed from the power supply terminals of the base substrate uniformly to the semiconductor pellet. As a result, the phenomenon that a high current is fed locally to the peripheral area of the base substrate on the basis of the parasitic resistance of the supply wiring can be eliminated to prevent the breakage of the chip-carrier type semiconductor device adopting the MCC structure, which would be good as a result of the burn-in.

According to the above-specified means (4), the multi-layered ceramic substrate or the aforementioned base substrate is wired uniformly with the power lines all over the internal wiring layer to enhance the absorptivity of the power noises thereby to improve the reliability in the operation of the circuit mounted on the semiconductor pellet and to form some local areas having no power wiring all over the internal wiring layer. As a result, it is possible to prevent both separation of the power wirings due to the difference in the linear expansion between the power wirings and establishment of gaps between the upper and lower ceramics of the internal wiring layer.

According to the above-specified means (5), the capacity element (e.g., a smoothing capacitor) can be inserted between the two kinds of power sources used in the aforementioned semiconductor device to enhance the absorptivity of the power noises thereby to improve the operational reliability of the circuit mounted on the semiconductor pellet.

In addition to the aforementioned operational effect (A), according to the above-specified means (6), the burn-in can be accomplished even after the plurality of semiconductor devices have been mounted on the module substrate.

The construction of the present invention will be described in the following in connection with one embodiment, in which the invention is applied to both the chip-carrier semiconductor device adopting the MCC structure and the semiconductor module having the plurality of semiconductor devices mounted on a module substrate.

Incidentally, throughout the Figures for describing the embodiment, the parts having identical functions are designated at identical reference numerals, and their repeated description will be omitted.

BRIEF DESCRIPTION OF THE DRAWINGS

FIG. 6 is a section showing the semiconductor device at the burn-in;

FIG. 7 is a section showing another example of the semiconductor device at the burn-in;

DESCRIPTION OF THE PREFERRED EMBODIMENTS

Embodiment 1

The construction of a chip-carrier type semiconductor device adopting the MCC structure according to an embodiment 1 of the present invention will be briefly described with reference to FIG. 1 (presenting a section) and FIG. 2 (presenting a perspective view of a base substrate).

Figure 1:
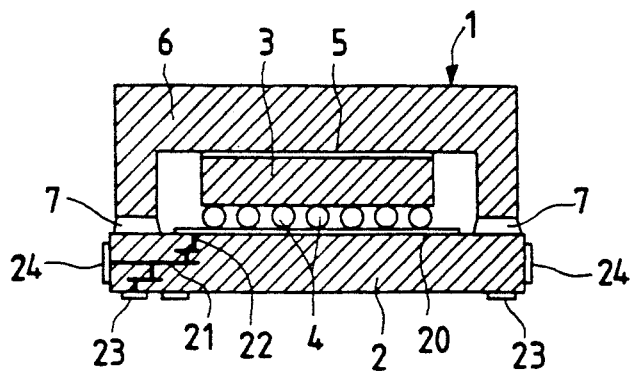
FIG. 1 is a section showing a chip-carrier type semiconductor device adopting an MCC structure according to an embodiment 1 of the present invention.

The chip-carrier type semiconductor device adopting the MCC structure, as designated at reference numeral 1 in FIG. 1, has a semiconductor pellet 3 mounted on a first face or main surface of a base substrate 2, i.e., on a face formed with a multi-layered wiring layer 20. The semiconductor pellet 3 is sealed up with a sealing cap 6.

The semiconductor pellet 3 is made of a substrate of single crystalline silicon, for example, and has any of a logical circuit system, a memory circuit system and a circuit system combining the former two on its circuit element formed face, i.e., on its principal face formed with solder bump electrodes 4. The circuit system is composed mainly of semiconductor elements such as bipolar transistors, complementary MISFETs (i.e., CMOSes), capacity elements and resistance elements.

The element formed face of the semiconductor pellet 3 is arrayed with not only the aforementioned circuit system but also a plurality of external terminals (e.g., bonding pads) to be electrically connected with the circuit system. The semiconductor pellet 3 is mounted on the main surface of the base substrate 2 in the so-called "face-down method" such that its element formed face faces the first face or main surface of the base substrate 2.

This base substrate 2 is constructed mainly of a multi-layered ceramic substrate. Specifically, the base substrate 2 is formed by laminating and sintering a plurality of mullite ceramic sheets (i.e., green sheets) which are formed with metallized wirings (i.e., thick film wirings) 21 on sheet-shaped substrates, for example. Although the number of laminations is not limitative, in the chip-carrier type semiconductor device 1 adopting the MCC structure of the present embodiment, the base substrate 2 uses four mullite ceramic sheets to form the three-layered metallized wirings 21 therein. This base substrate 2 has its upper and lower metallized wirings 21 electrically connected through connecting hole wirings (or through hole wirings) 22 formed in connection holes (or through holes) formed in the mullite ceramic sheet. Since the metallized wirings 21 and the connection hole wirings 22 are individually shaped by sintering the mullite ceramic sheets at a high temperature, they are formed of a refractory metal such as tungsten (W) such that the metallized wirings 21 are formed of tungsten to have a thickness of about 30 [microns], for example. Incidentally, in case the base substrate 2 is shaped by a low-temperature sintering, the metallized wirings 21 may be made of copper (Cu) paste having a low resistance.

The surface of the base substrate 2, on which the semiconductor pellet 3 is mounted, is arrayed with a plurality of first connection terminals, although not shown. These connection terminals are individually connected, as shown in FIGS. 1 and 2, through the metallized wirings 21 and the connection hole wirings 22 of the base substrate 2 with a plurality of first mounting terminals or mounting terminals 23 which are arrayed on the second face or rear surface opposite to said first face of the base substrate 2. The terminals arrayed on said first face of the base substrate 2 and the mounting terminals 23 arrayed on the second face are all made of a refractory metal such as tungsten like the metallized wirings 21. In the present embodiment, the second face or rear surface of the base substrate 2 of the semiconductor device 1 adopting the MCC structure is arrayed densely with a number of mounting terminals 23 substantially all over its area.

The plurality of terminals arrayed on the first face of the base substrate 2 are individually connected, as shown in FIG. 1, through the multi-layered wiring layer 20 and the solder bump electrodes (e.g., solder balls, projection electrodes or CCB electrodes) with the plurality of external terminals arrayed on the semiconductor pellet 3.

The aforementioned multi-layered wiring layer 20 is prepared by laminating a plurality of wiring layer and insulating resin layers alternately, although not shown in detail in FIG. 1. The wiring layers are formed with copper wirings (or aluminum wirings or aluminum alloy wirings), for example, and these copper wirings are formed of a thin film of about 10 [microns], for example. The upper and lower wiring layers are electrically connected through the connection holes which are formed in the insulating resin layers. These insulating resin layers are made of a polyimide resin, for example. The multi-layered wiring layer 20 thus formed is prepared either by laminating insulating resin layers and wiring layers alternately on the main surface of the base substrate 2 after this base substrate 2 has been formed or by applying a prepared multi-layered wiring layer on the main surface of the base substrate 2. The insulating resin layers of the multi-layered wiring layer 20 are prepared by applying and curing a resin. The connection holes are formed by the photolithography technology or the etching technology. The wiring layers are deposited by the sputtering method, for example, and are patterned by the photolithography technology or the etching technology. In the present embodiment, the multi-layered wiring layer 20 is deemed to form part of the base substrate 2.

The external terminals of the aforementioned semiconductor pellet 3 can be finely worked because they are formed by depositing the wiring layers at the same step as that of the wirings connecting the semiconductor elements of the circuit system and by patterning the wiring layers by the photolithography technology and the etching technology. The wiring layers are formed, for example, of a single layer of aluminum wirings or aluminum alloy wirings or of a laminate composed mainly of the single layers. On the contrary, the terminals formed on said main surface of the base substrate 2, the metallized wirings 21 and the mounting terminals 23 are shaped by depositing them by the printing method and by sintering them, and the connection holes are formed by mechanically punching them. Basically, the multi-layered wiring layer 20 is basically constructed to absorb the difference in the array pitch between the plurality of external terminals arrayed on the semiconductor pellet 3 and the plurality of terminals arrayed on the main surface of the base substrate 2, because the array terminals of the terminals of the base substrate 2 is larger than the array pitch of the external terminals of the semiconductor pellet 3.

On the other hand, the multi-layered wiring layer 20 is constructed with a view to causing the insulating resin layers to absorb the stress which is generated on the basis of the temperature cycle due to the difference between the linear expansion coefficients of the semiconductor pellet 3 and the base substrate 2 thereby to reduce the damage and breakage of the solder electrodes 3.

The external terminals of the aforementioned semiconductor pellet 3 and the terminals of the multi-layered wiring layer 20 of the base substrate 2 are individually connected electrically and mechanically through the solder electrodes 4. These solder electrodes 4 are made of a Pb—Sn alloy (containing 97 [wt. %] of Pb and 3 [wt. %] of Sn). A ball-limiting metallization layer for retaining the wettability of the solder is individually formed between the external terminals of the semiconductor pellet 3 and the solder electrodes 4 and between the terminals of the multi-layered wiring layer 20 and the solder electrodes 4, as should be referred to the above-specified Japanese Patent Laid-Open No.310139/1988.

The sealing cap 6 for sealing the semiconductor pellet 3 is fixed on the main surface of the base substrate 2 at its peripheral area so that the semiconductor pellet 3 is sealed up in the cavity which is formed by the base substrate 2 and the sealing cap 6. This sealing cap 6 is made of aluminum nitride having a small thermal expansion coefficient, for example, so that it can reduce the stress to be generated in the temperature cycle, especially a vertical stress thereby to reduce the damage and breakage of the solder electrodes 4.

The sealing cap 6 and the base substrate 2 are mechanically fixed through a sealing adhesive layer 7. This sealing adhesive layer 7 used is made, for example, of a Pb—Sn alloy (containing 90 [wt. %] of Pb and 10 [wt. %] of Sn) having a slightly lower melting point than that of the aforementioned solder electrodes 4.

Moreover, the inner wall of the cavity of the sealing cap 6 facing the semiconductor pellet 3 and the rear surface of the semiconductor pellet 3 are connected through a thermally conductive layer 5 made of a material identical to that of the aforementioned sealing adhesive layer 7, for example, so that the heat to be generated by the operation of the circuit system of the semiconductor pellet 3 is efficiently conducted to the sealing cap 6.

Figure 2:
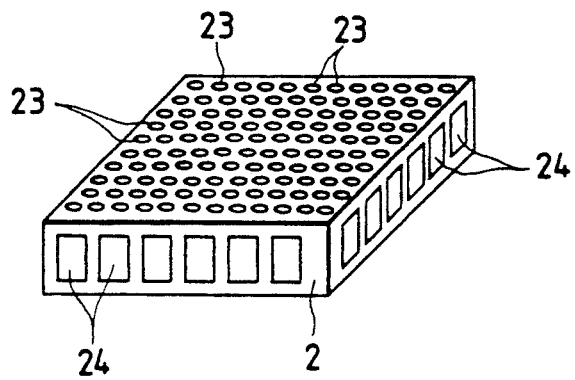
FIG. 2 is a perspective view showing a base substrate of the semiconductor device.

The chip-carrier type semiconductor device 1 adopting the MCC structure thus constructed is arrayed, as individually shown in FIGS. 1 and 2, on a third face or side surface of the base substrate 2 with auxiliary terminals 24 to be used as testing terminals, for example, separately of the mounting terminals 23 which are arrayed on the rear surface of the base substrate 2. In the present embodiment, the base substrate 2 is formed to have a square shape (having square main surface and rear surface) in its top plan view so that its four sides are individually arrayed with a plurality of first auxiliary terminals 24.

These auxiliary terminals 24 are constructed mainly to supply the burning-in powers to the semiconductor device 1 adopting the MCC structure at the burn-in step. Thus, the auxiliary terminals 24 are individually connected through the power supplying metallized wirings 21 and the connection hole wirings 22 in the base substrate 2 with the power supplying external terminals of the semiconductor pellet 3 or the power supplying mounting terminals 23 of the base substrate 2. Moreover, the auxiliary terminals 24 are made to have a larger size than that of the mounting terminals 23 with a view to retain the abutting area and the displacement because they abut against the power terminals (10 V) of a later-described testing socket (10).

Figure 3:
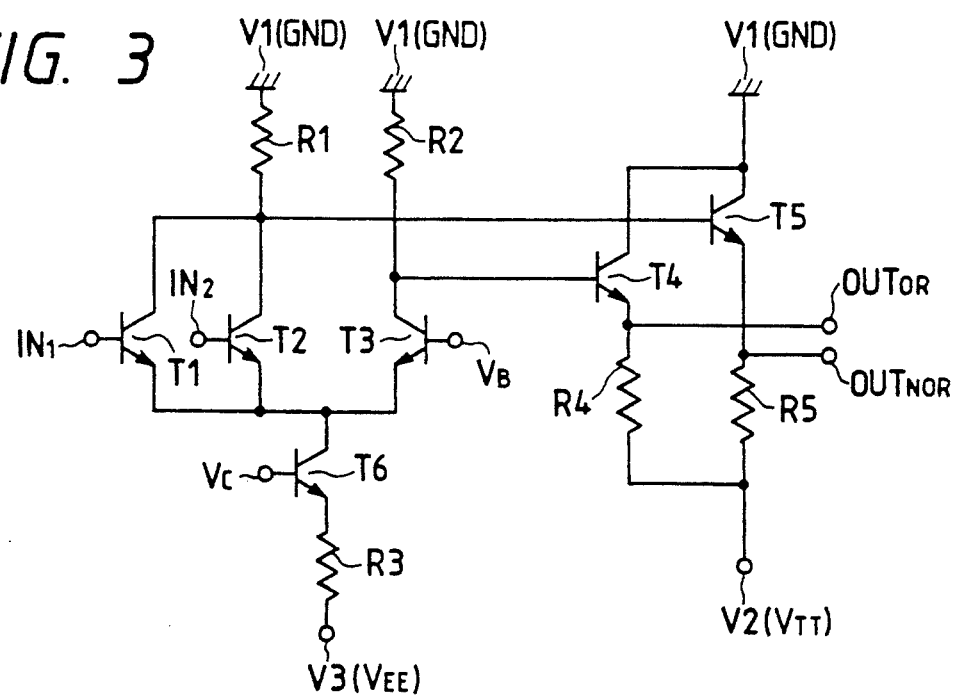
FIG. 3 is a diagram showing a circuit equivalent to a semiconductor pellet of the semiconductor device.

In case the circuit system of the semiconductor pellet 3 of the semiconductor device 1 adopting the MCC structure is composed mainly of bipolar transistors and in case an ECL (i.e., Emitter Coupled Logic) basic OR gate circuit shown in FIG. 3 (presenting an equivalent circuit diagram), for example, is incorporated into the circuit system, the base substrate 2 is equipped with at least three kinds of auxiliary terminals 24 to be used as the testing terminals, for example.

The ECL basic OR gate circuit, as shown in FIG. 3, is composed mainly of: bipolar transistors T1, T2, T3 and T6; resistance elements R1, R2 and R3; and bipolar transistors T4 and T5 and resistance elements R4 and R5 which constitute altogether an output stage circuit.

The bipolar transistor T1 has its base region connected with an input signal terminal $IN_1$; the bipolar transistor T2 has its base region connected with an input signal terminal $IN_2$; and the bipolar transistor T6 has its base region connected with a terminal $V_c$. The terminal $V_c$ is applied to a constant voltage $V_{cs}$ which is output from a constant voltage generator although not shown. The bipolar transistor T3 has its base region connected with a threshold power terminal $V_B$ of a current switch. The terminal $V_B$ is applied to a reference voltage $V_{BB}$ for determining said threshold voltage of said current switch. The bipolar transistor T4 has its emitter region connected with an OR output terminal $OUT_{OR}$, and the bipolar transistor T5 has its emitter region connected with a NOR output terminal $OUT_{NOR}$.

The individual collector regions of the bipolar transistors T1, T2, T3, T4 and T5 are connected with a power supply terminal V1. This supply terminal (GND) V1 is supplied with a voltage at 0 [V] such as a ground potential, for example. The emitter region of the bipolar transistor T6 is connected through the resistance element R3 with a power supply terminal V3 ($V_{EE}$). This power supply terminal V3 ($V_{EE}$) is supplied with a voltage of −4 [V] such as a negative power supply voltage, for example. The emitter region of the bipolar transistor T4 and the emitter region of the bipolar transistor T5 are connected through the resistance elements R4 and R5, respectively, with a power supply terminal V2 ($V_{TT}$). This power supply terminal V2 ($V_{TT}$) is supplied with a voltage of −2 [V] such as a negative powr supply voltage, for example.

In case of the ECL basic OR gate circuit (using bipolar transistors), for example, an electric current flows in the circuit at all times if the power is supplied. For the burn-in, therefore, it is sufficient to array the side surfaces of the base substrate 2 with at least three kinds of auxiliary terminals 24 for supplying the powers V1, V2 and V3, respectively.

Figure 4:
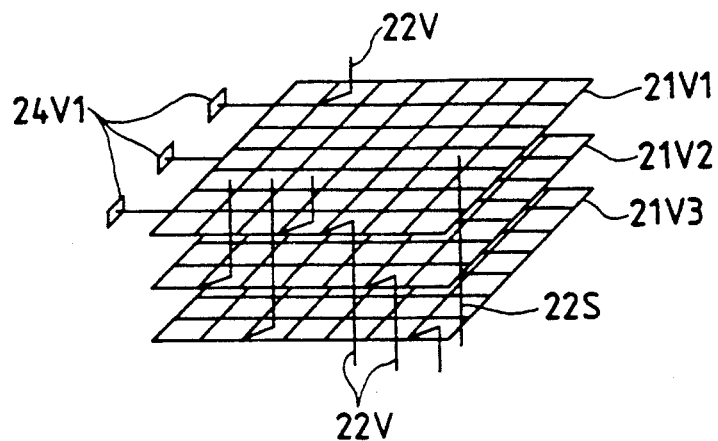
FIG. 4 is a conceptional diagram showing a model of the structure of the power wirings of the base substrate.
Figure 5:
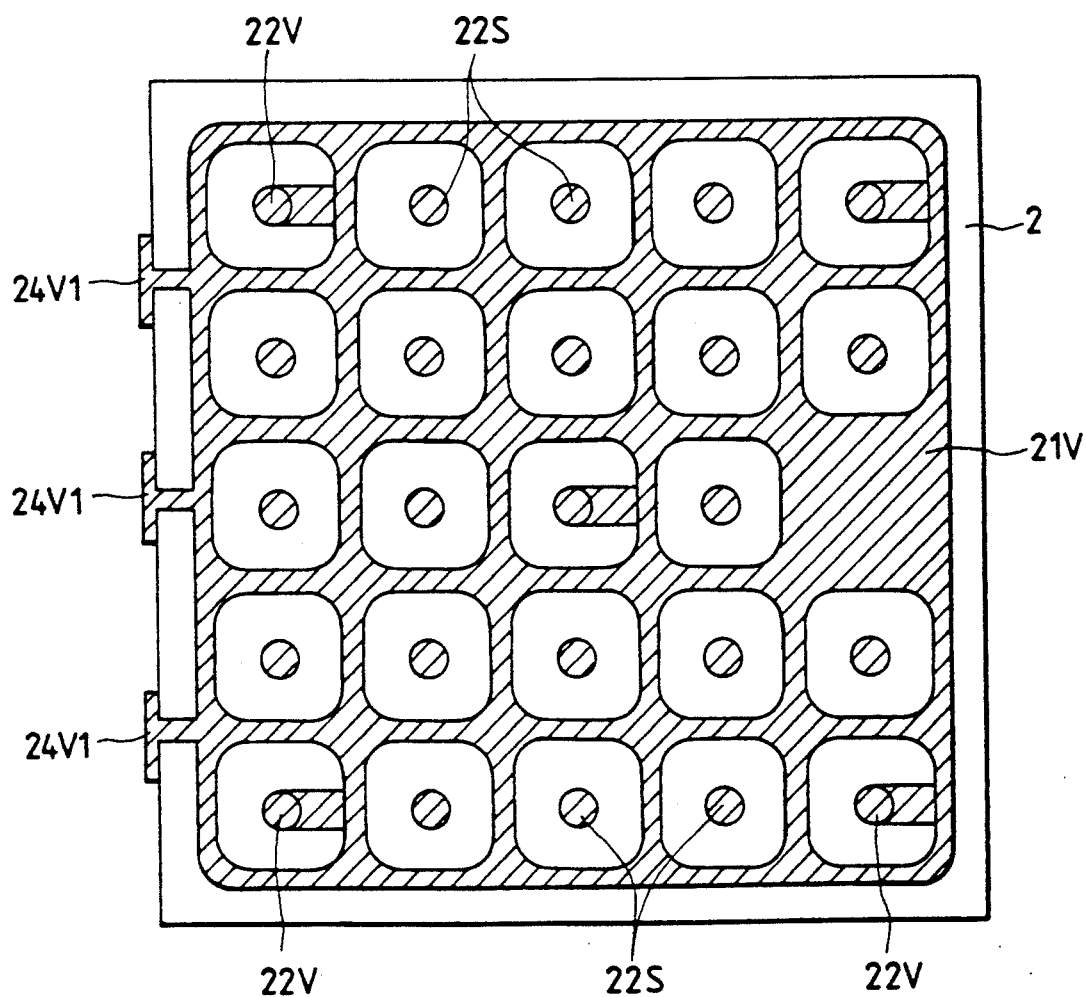
FIG. 5 is a layout showing the power wirings of the base substrate.

The power supplying metallized wirings 21V in the aforementioned base substrate 2 are wired, as respectively shown in FIG. 4 (presenting a conceptional diagram showing a model structure of the power supply wirings) and FIG. 5 (presenting a layout of the power supply wirings), substantially all over the area of the base substrate 2 such that one wiring layer forms a mesh shape (or a lattice shape or a plain shape). These power supplying metallized wirings 21V are supplied individually at their wiring layers with different powers such that: the upper layer is supplied with the power source V1; the middle layer is supplied with the power source V2; and the lower layer is supplied with the power source V3.

Since the power supplying metallized wirings 21V in the base substrate 2 are wired in the mesh shape, as described above, the mesh center portions, where the power supplying metallized wirings 21V are absent, can be locally arranged with the connection hole wirings 22. In other words, the power supplying metallized wirings 21V of the base substrate 2 are supplied with the power from power supplying mounting terminals 23V at the rear surface of the base substrate 2 through power supplying connection hole wirings 22V so that the power supplied to the power supplying metallized wirings 21V is further fed to the power supplying external terminals of the semiconductor pellet 3. The power supplying mounting terminals 23V and the power supplying connection hole wirings 22V are individually arrayed regularly by a predetermined number in a manner to correspond to the array pitch of the mesh so that the power is uniformly supplied from the plurality of portions of the rear surface of the base substrate 2 to the power supplying metallized wirings 21V.

The mesh center portions, which are arranged neither the power supplying metallized wirings 21V in the base substrate 2 nor the power supplying connection hole wirings 22V, are arranged with signal connection hole wirings 22S. In other words, signal mounting terminals 23S on the rear face of the base substrate 2 and the signal external terminals of the semiconductor pellet 3 individually transmit the signals through the signal connection hole wirings 22S in the base substrate 2.

Since, moreover, the planar shape of the aforementioned power supplying metallized wirings 21V is formed in the mesh shape (i.e., not all over the surface of the base substrate 2), there can be regularly formed between the power supplying metallized wirings 21V and the mullite ceramic sheets of the base substrate 2 the areas in which the two are not in contact with each other. In other words, the stress based on the difference in the thermal expansion coefficients between the power supplying metallized wirings (of tungsten) 21V and the mullite ceramic sheets can be reduced to prevent the power supplying metallized wirings 21V from being separated from the surface of the ceramic sheets.

Moreover, the power supplying metallized wirings 21V are electrically connected, as shown in FIGS. 4 and 5, with the auxiliary terminals or testing terminals 24V1 which are arrayed on the side surfaces of the base substrate 2.

Figure 6:
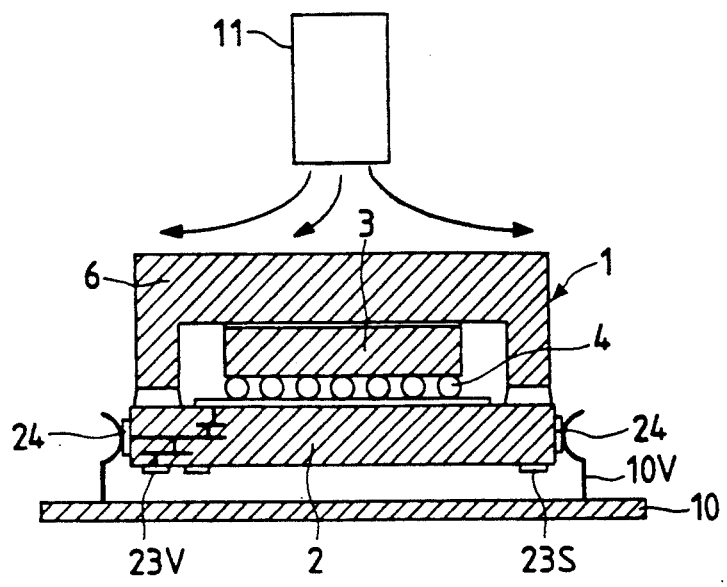

The chip-carrier type semiconductor device 1 adopting the MCC structure thus constructed is set, as shown in FIG. 6 (presenting a section at the burn-in), in a burning-in socket 10 and is burned in. This setting of the chip-carrier type semiconductor device 1 adopting the MCC structure in the burning-in socket 10 is accomplished by bringing the auxiliary terminals 24 (i.e. the testing terminals 24V1 in the present embodiment), which are arranged on the side surfaces of the base substrate 2, into abutment against power supply terminals 10V of the burning-in socket 10. Since the power supply terminals 10V of the burning-in socket 10 are constructed to have a suitable flexibility, they are given functions to effect the abutment of the auxiliary terminals 24 and to clamp the semiconductor device 1 adopting the MCC structure. This semiconductor device 1 may be clamped not only by the power supply terminals 10V but also by other support members. In case the semiconductor pellet 3 of the semiconductor device adopting the MCC structure has its circuit system composed mainly of the bipolar transistors, the object of the burn-in can be achieved merely by supplying the power but not any signal from the outside, as has been described hereinbefore. The burn-in is performed while cooling down the chip-carrier type semiconductor device 1 adopting the MCC structure, especially its semiconductor pellet 3 by injecting a substance having an electrically insulating property, or an inert liquid coolant such as fluorocarbon in the form of a coolant jet from a cooling nozzle 11.

Figure 7:
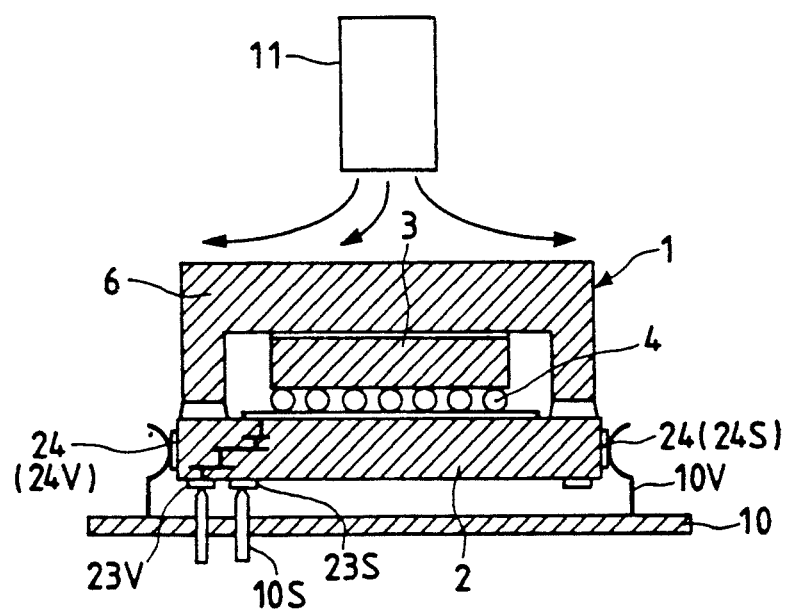

As shown in FIG. 7 (presenting a section showing another example at the burn-in), on the other hand, the burning-in socket 10 may be arranged signal terminals 10S in addition to the power supply terminals 10V. The signal terminals 10S of the burning-in socket 10 can come into abutment of the signal mounting terminals 23S on the rear surface of the base substrate 2 of the semiconductor device 1 adopting the MCC structure to feed signals necessary for the burn-in from the outside. In case the semiconductor device 1 adopting the MCC structure has its circuit system composed mainly of either MISFETs or complementary MISFETs, the burning-in method, as described with reference to FIG. 7, has to be adopted to feed the signals for controlling and driving the circuit operations, because no current basically flows with the supply of electric power only.

The burning-in socket 10 shown in FIG. 7 has its signal terminals 10S arranged in positions to abut against the signal mounting terminals 23S on the rear surface of the base substrate 2 of the semiconductor device 1 adopting the MCC structure but may have its signal terminals 10S constructed to have a structure substantially identical to the power supply terminals 10V and arranged in positions to abut against the side surfaces of the base substrate 2. In this case, the semiconductor device 1 adopting the MCC structure is arranged on the side surfaces of the base substrate 2 with not only power testing terminals 24V but also signal testing terminals 24S.

Moreover, the signal terminals 10S of the burning-in socket 10 shown in FIG. 7 may also be used as temperature measuring terminals in case the semiconductor pellet 3 of the chip-carrier type semiconductor device 1 adopting the MCC structure has its circuit system composed mainly of the bipolar transistors.

Figure 8:
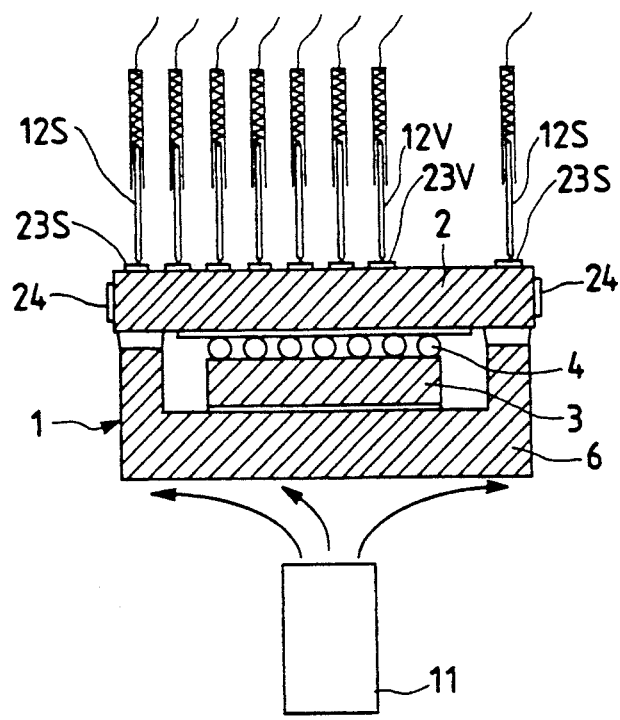
FIG. 8 is a section showing the semiconductor device at the function testing time.

As shown in FIG. 8 (presenting a section at the time of testing functions), the chip-carrier type semiconductor device 1 adopting the MCC structure is subjected to a screening function test at the preceding and/or succeeding stages of the burning-in. In this function test, power supply contact pins 12V are made to abut against the power supply mounting terminals 23V arrayed on the rear surface of the base substrate 2 of the semiconductor device adopting the MCC structure, and the signal contact pins 12S are made to abut against the signal mounting terminals 23S. In short, the chip-carrier type semiconductor device 1 adopting the MCC structure is subjected to the function test by supplying the power and the signals from the outside and by outputting the signals to the outside. This function test is accomplished, like the aforementioned burn-in, while cooling down the semiconductor device 1 adopting the MCC structure by injecting a coolant jet from the cooling nozzle 11.

Figure 9:
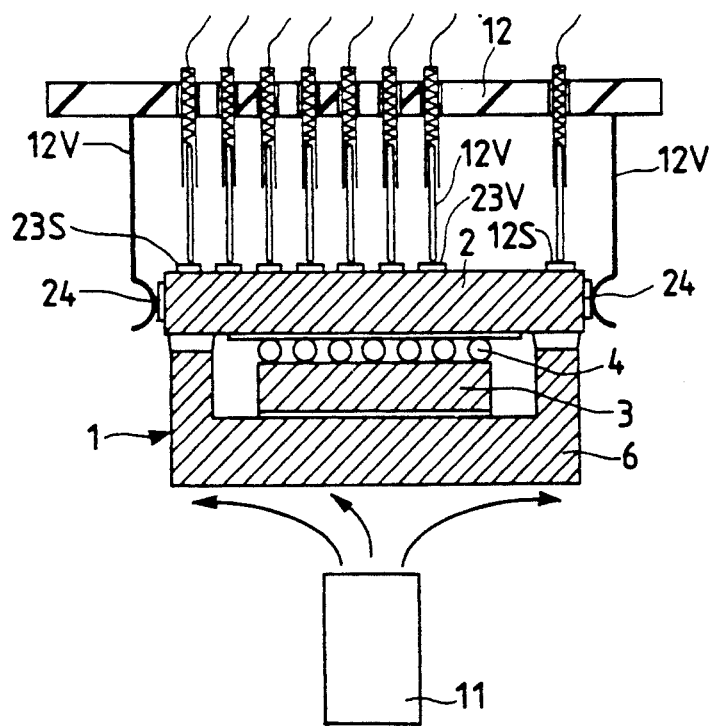
FIG. 9 is a section showing another example of the semiconductor device at the function testing time.

Alternatively, the semiconductor device 1 adopting the MCC structure may be supplied in the function test, as shown in FIG. 9 (presenting a section showing another example of the function test), with the power (23V) and the signals (23S) through the mounting terminals 23 arrayed on the rear surface of the base substrate 2 and with the power and the signals through the testing auxiliary terminals 24 arrayed on the side surfaces of the base substrate 2.

Figure 10:
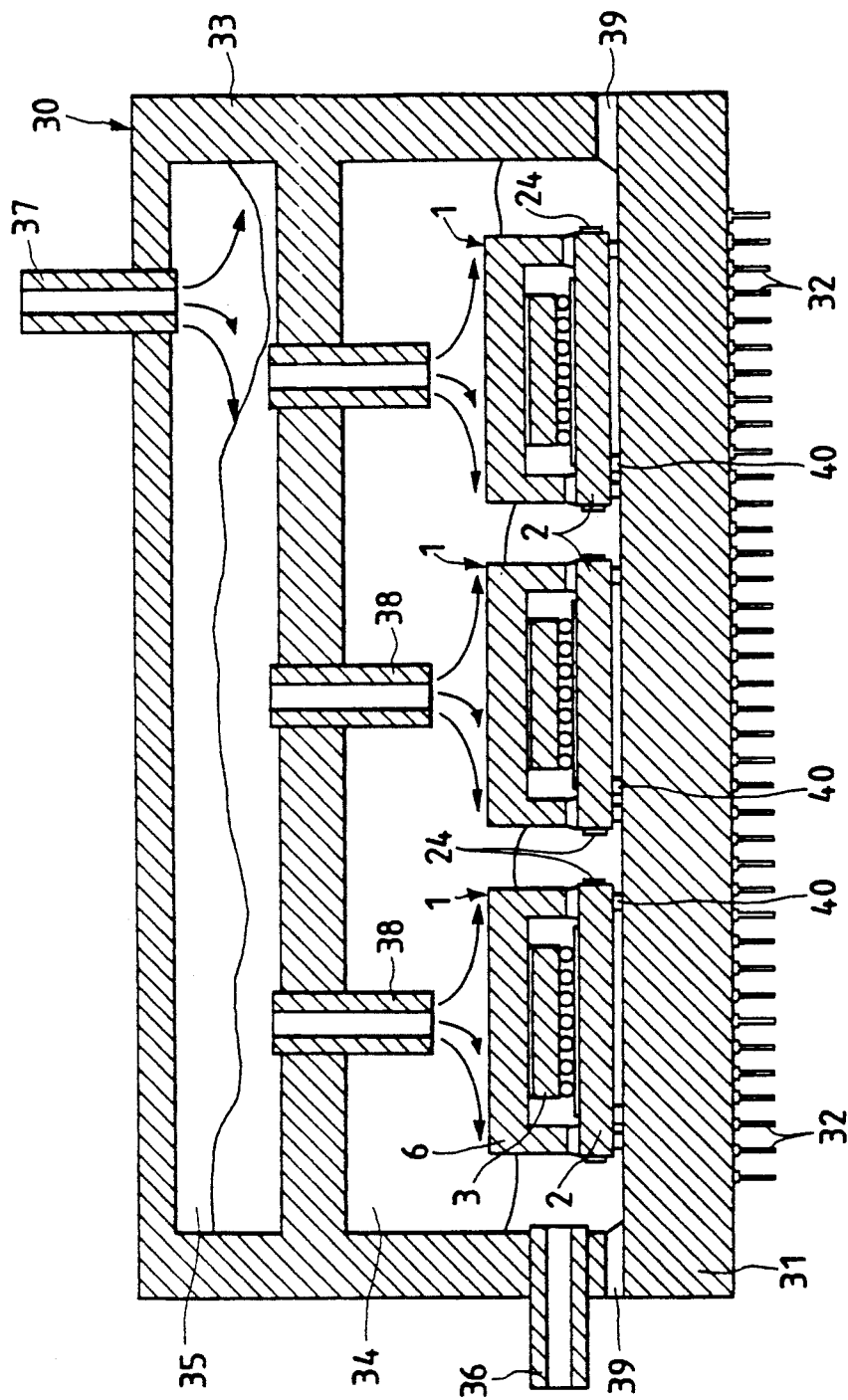
FIG. 10 is a section showing a semiconductor module having the semiconductor devices sealed therein.

After the end of the packaging process, the semiconductor device 1, which has been selected as a good product by the aforementioned screening and adopts the MCC structure, is sealed in a semiconductor module 30, as shown in FIG. 10 (presenting a section showing the semiconductor module). This semiconductor module 30 seals up the plurality of semiconductor devices 1 adopting the MCC structure, which are mounted on the principal face having the second terminals of a module substrate 31, with a module cap 33.

The module substrate 31 of the semiconductor module 30 is basically constructed to have a structure, e.g., a multi-layered mullite ceramic substrate, identical to that of the base substrate 2 of the semiconductor device 1 adopting the MCC structure. Specifically, the module substrate 31 is arrayed on its principal surface with a plurality of second connection terminals to abut against the mounting terminals 23 of the semiconductor devices 1 adopting the MCC structure, and the second terminals are electrically connected through a plurality of inside metallized wiring layers with a plurality of mounting pins 32 which in turn are electrically connected with the second mounting terminals mounted on the back surface.

The aforementioned module cap 33 is made of aluminum nitride, for example, and is mechanically fixed on the surface of the module substrate 31 through a module sealing adhesive layer 39. This module sealing adhesive layer 39 used is made of a Pb—Sn alloy, for example, which has a melting point slightly lower than those of solder bump electrodes 40 which are used to mount the sealing adhesive layer 7 of the semiconductor device 1 adopting the MCC structure and the semicondutor device 1 adopting the MCC structure on the surface of the module substrate 31.

The module cap 33 is formed at its side close to the module substrate 31 with a cavity 34 for sealing up the semiconductor devices 1 adopting the MCC structure and at its remote side with a coolant supplying cavity 35 for supplying an inert liquid coolant uniformly all over the foregoing cavity 34. Specifically, the coolant supplying cavity 35 can disperse the inert liquid coolant, which is injected from a coolant inlet port 37, uniformly in its inside and can inject the inert liquid coolant through coolant nozzles 38 into the semiconductor devices 1 adopting the MCC structure and disposed in the cavity 34. The plurality of coolant nozzles 38 are arranged in individual positions corresponding to the semiconductor devices 1 adopting the MCC structure, which are mounted the module substrate 31. The inert liquid coolant thus injected into the cavity 34 cools down the semiconductor device 1 adopting the MCC structure and is then discharged to the outside of the semiconductor module 30 through a coolant outlet port 36.

The semiconductor devices 1 adopting the MCC structure thus sealed in the semiconductor module 30 can be burned in for the screening by causing the power supply terminals 10V of the testing socket 10 to abut against the auxiliary terminals 24 while they are mounted on the module substrate 31 before they are sealed up with the module cap 33.

Next, a first method of forming the base substrate 2 of the aforementioned semiconductor device 1 adopting the MCC structure will be briefly described with reference to FIGS. 11A and 11B (presenting perspective views showing the individual forming steps), and a second method will be briefly described with reference to FIGS. 12A and 12B (presenting perspective views showing the individual forming steps).

First Forming Method

First of all, a plurality of mullite ceramic sheets having a size corresponding to the base substrate 2 are formed with connection holes in predetermined positions and then with metallized wirings 21 on the surfaces of the mullite ceramic sheets and with the connection hole wirings 22 in the connection holes. These connection holes are formed by the punching method.

Next, the plurality of mullite ceramic sheets are laminated, and this laminate of ceramic sheets has its surface formed with metallized wirings corresponding to the terminals of the base substrate 2 or the mounting terminals 23. After this, the laminate is sintered at a high temperature to form the multi-layered mullite ceramic substrate.

Figure 11A:
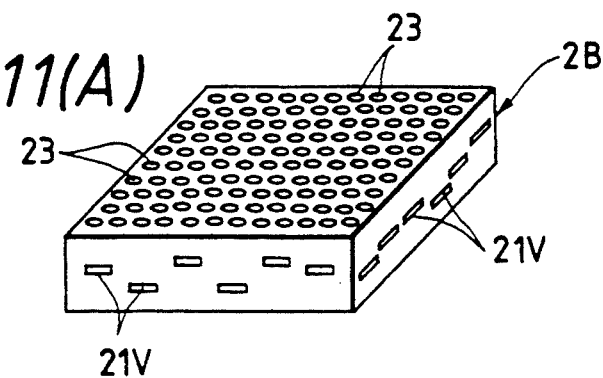
FIGS. 11A and 11B present perspective views showing the individual steps of forming the base substrate.
Figure 12A:
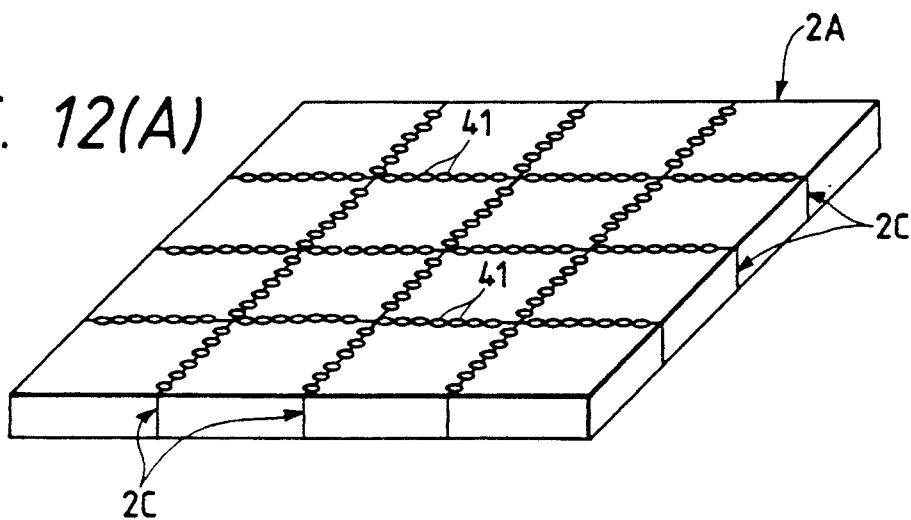
FIGS. 12A and 12B present perspective views showing the individual steps of forming another example of the base substrate.

Next, as shown in FIG. 11(A), the multi-layered mullite ceramic substrate is cut and divided to a predetermined size to form a single multi-layered mullite ceramic substrate 2B corresponding to the base substrate 2 of the semiconductor device 1 adopting the MCC structure. The cutting and dividing operation is accomplished by using a diamond cutter, for example. The divided single multi-layered mullite ceramic substrate 2B has its end faces (or cut faces) of the power supplying metallized wirings 21V to the outside at the cut sides, as shown in FIG. 11(A).

Figure 11B:
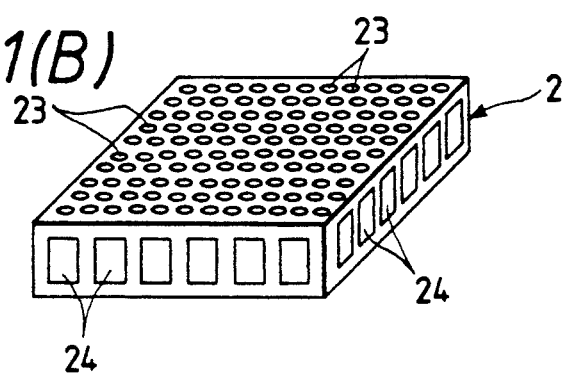

Next, the multi-layered mullite ceramic substrate 2B has its end faces printed with a paste of tungsten or the like and sintered at a low temperature to complete the base substrate 2 having the auxiliary terminals 24, as shown in FIG. 11(B). These auxiliary terminals 24 on the side surfaces of the base substrate 2 are electrically connected with the metallized wirings 21 in the base substrate 2.

The base substrate 2 thus formed by the first forming method is formed with the auxiliary terminals 24 having a small thickness of about 30 [microns], for example, on the flat sides cut by the diamond cutter so that their sides are formed into relatively flat faces.

Second Forming Method

Like the aforementioned first forming method, a plurality of mullite ceramic sheets are laminated at first to form a multi-layered mullite ceramic substrate 2A, and this multi-layered mullite ceramic substrate 2A is formed on its surface with metallized wirings corresponding to the terminals of the base substrate 2 or the mounting terminals 23. At the same step as that step of forming the metallized wirings, as shown in FIG. 12(A), a refractory metal such as tungsten is buried in holes 41 which are formed in advance in cut areas 2C of the multi-layered mullite ceramic substrate 2A. Those holes 41 may be basically stop holes or through holes. The through holes can be formed, for example, by punching out the plurality of laminated multi-layered mullite ceramic substrate 2A all at once. The stop holes can be formed by punching out some of the plurality of laminated sheets of the multi-layered mullite ceramic substrate to form punched through holes and subsequently by applying the remaining mullite ceramic sheets to that laminated mullite ceramic substrate.

Figure 12B:
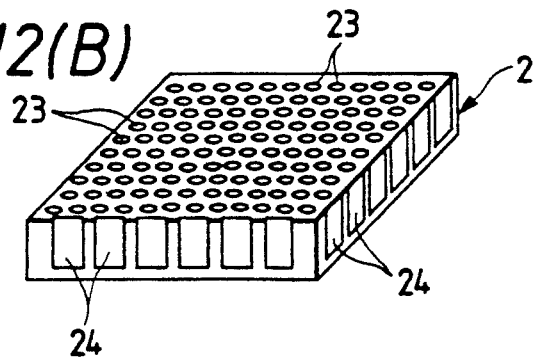

Next, the multi-layered mullite ceramic substrate 2A is cut at the cut areas 2C to form the base substrate 2 which is formed with the auxiliary terminals 241 on its sides, as shown in FIG. 12(B).

The base substrate 2 formed by this second forming method can have its step number reduced because the auxiliary terminals 24 can be formed at the same step as that of forming the other metallized wirings.

Thus, the following operational effects can be achieved according to the semiconductor device 1 adopting to the MCC structure of the present embodiment 1.

(1) In the semiconductor device 1 adopting the MCC structure, in which the plurality of external terminals arrayed on the element forming face of the semiconductor pellet 3 mounted by the face-down method on the surface of the base substrate 2 are electrically connected with the plurality of mounting terminals 23 arrayed on the rear surface opposite to the main surface of the base substrate 2, this base substrate 2 is formed on its side with either power supplying test terminals 24V, which are electrically connected with power supply ones of the plurality of external terminals arrayed on the element forming face of the semiconductor pellet 3, or the power supply terminals 24V and the signal testing terminals 24S which are electrically connected with the signal external terminals. Thanks to this construction, (A) At the burn-in for the screening, when good and defective semiconductor devices 1 adopting the MCC structure are to be selected at an initial stage before they are shipped to customers after the packaging process, the circuit system of the semiconductor pellet 3 can be fed with either the power or the power and the signals through the testing terminals 24, which are formed on the side surfaces of the base substrate 2 of the semiconductor device 1 adopting the MCC structure. As a result, the testing wiring board (or the baby board), which might otherwise be necessary for the burn-in, need not be used. Thanks to the unuse of that testing wiring board, it is basically possible to free the testing wiring board, which is made of a resin board, of the problem that the working of the connection holes between the upper and lower wirings has a limit and the testing wiring board, which is made of a multi-layered ceramic substrate, of the problem that the working and manufacture are complicated. (B) Since the testing terminals 24 are arranged on the side surface of the base substrate 2 of the aforementioned semiconductor device 1 adopting the MCC structure other than the rear surface of the same, the plurality of mounting terminals 23 arrayed on the rear surface of the base substrate 2 can be finely worked independently of those testing terminal 24. As a result, the mounting terminals 23 of the semiconductor device 1 adopting the MCC structure can be multiplied. (C) Since the plurality of mounting terminals 23 are arrayed on the rear surface of the base substrate 2 of the aforementioned semiconductor device 1 adopting the MCC structure, the number of arrays of the mounting terminals 23 can be increased more than that of the case, in which they are arrayed on the side surface of the base substrate 2, so that the mounting terminals 23 of the semiconductor device 1 adopting the MCC structure can be multiplied. (D) Since the semiconductor pellet 3 is mounted by the face-down method on the main surface of the base substrate 2 of the aforementioned semiconductor device 1 adopting the MCC structure, the size of the base substrate 2 can be reduced, as compared with the case of the face-up method in which the wires are led out to the periphery of the semiconductor pellet 3, to an extent corresponding to the leading area of the wires, so that the semiconductor device 1 adopting the MCC structure can be miniaturized.

(2) The testing terminals 24 formed on the side surface of the base substrate 2 of the foregoing means (1) are made to have a larger area (or size) than that of the plurality of mounting terminals 23 arrayed on the rear surface of the base substrate 2. Thanks to this construction, when the power supply terminals 10V (or test styluses) of the testing socket 10 are brought into abutment against the testing terminals 24 at the burn-in of the aforementioned screening, surpluses are established for the area between the testing terminals 24 and the power supply terminals 10V and for the displacement of the two so that the power supply terminals 10V can be reliably brought into abutment against the testing terminals 24 thereby to enhance the reliability in selecting the good and defective products at the initial stage by the burn-in. Moreover, the abutment can be facilitated to improve the workability of the burn-in.

(3) The base substrate 2 according to the foregoing means (1) and (2) is constructed of the multi-layered mullite ceramic substrate which is prepared by laminating and sintering the plurality of mullite ceramic sheets having their surface formed with the metallized wirings 21, and the power supply metallized wirings 21V formed of the metallized wirings 21 of the multi-layered mullite ceramic substrate are constructed to have a mesh-shaped planar shape all over the internal metallized wiring layer of the multi-layered mullite ceramic substrate. Thanks to this construction, the multi-layered mullite ceramic substrate or the aforementioned base substrate 2 is wired uniformly with the power supplying metallized wirings 21V all over the internal metallized wiring layer to enhance the absorptivity of the power noises thereby to improve the reliability in the operation of the circuit system mounted on the semiconductor pellet 3 and to form some local areas having no power supplying metallized wirings 21V all over the internal metallized wiring layer. As a result, it is possible to prevent both separation of the power supplying metallized wirings 21V due to the difference in the linear expansion between the mullite ceramics in the internal metallized wiring layer and the power supplying metallized wirings 21V and establishment of gaps between the upper and lower mullite ceramics of the internal metallized wiring layer.

(4) The mounting terminals 23 on the rear surface of the base substrate 2 of the semiconductor device 1 adopting the MCC structure according to the foregoing means (1) to (3) and the terminals on the surface of the module substrate 31 are electrically connected to constitute the semiconductor module 30 having the plurality of semiconductor devices 1 adopting the MCC structure and mounted on the surface of the aforementioned module substrate 31. Thanks to this construction, in addition to the operational effect (1) of the aforementioned means (1), the burn-in for the screening can be accomplished even after the plurality of semiconductor devices 1 adopting the MCC structure have been mounted on the module substrate 31.

Embodiment 2

According to the second embodiment of the present invention, in the chip-carrier type semiconductor device 1 adopting the MCC structure, the mounting mode of the semiconductor pellet on the surface of the base substrate is changed.

Figure 13:
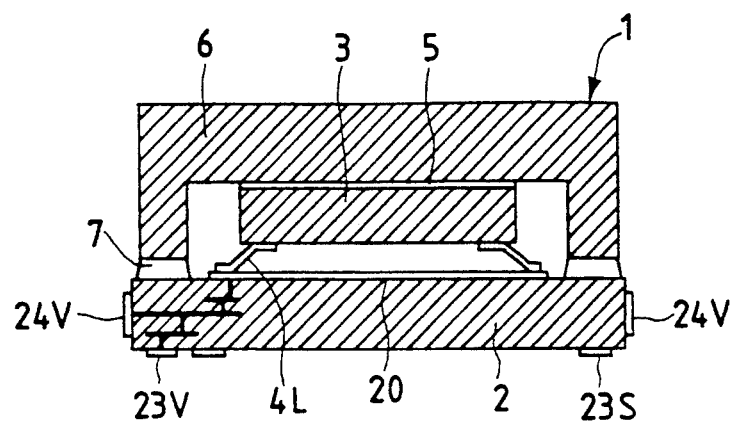
FIG. 13 is a section showing a chip-carrier type semiconductor device adopting an MCC structure according to an embodiment 2 of the present invention.

The construction of the semiconductor device adopting to the MCC structure according to the embodiment 2 of the present invention is shown in FIG. 13 (presenting a section).

In the chip-carrier type semiconductor device 1 adopting the MCC structure, as shown in FIG. 13, the external terminals of the semiconductor pellet 3 and the terminals of the multi-layered wiring layer 20 of the base substrate 2 are connected electrically and mechanically with each other through TAB (i.e., Tape Automated Bonding) leads 4L, and the semiconductor pellet 3 is mounted on the surface of the base substrate 2. These TAB leads 4L are made of Cu or a laminated layer comprises mainly of Cu (i.e., comprised of a Cu mother body plated with Sn) and have an elasticity.

The semiconductor device 1 adopting the MCC structure thus constructed can prevent the connection areas of the external terminals of the semiconductor pellet and the terminals of the multi-layered wiring layer 20 from being damaged or broken to elongate the lifetime of the connection areas, because the stress to be established in the connection areas due to the temperature cycle can be absorbed by the TAB leads 4L.

Embodiment 3

In the third embodiment of the present invention, the shape of the mounting terminals of the base substrate is changed in the semiconductor device adopting the MCC structure.

Figure 14:
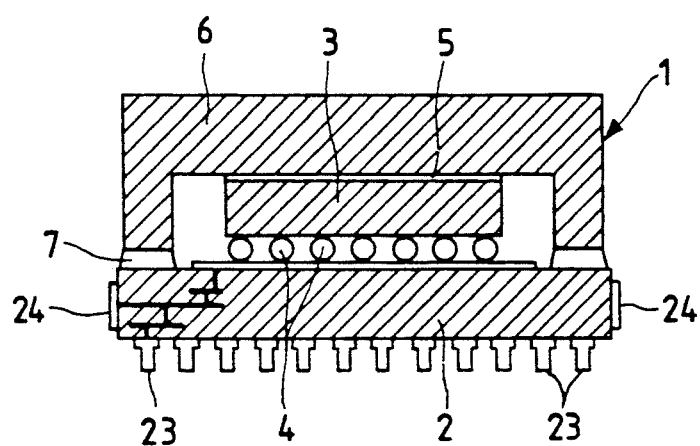
FIG. 14 is a section showing a chip-carrier type semiconductor device adopting an MCC structure according to an embodiment 3 of the present invention.

The construction of the semiconductor device adopting the MCC structure according to the embodiment 3 of the present invention is shown in FIG. 14 (presenting a section).

As shown in FIG. 14, the chip-carrier type semiconductor device 1 adopting the MCC structure is arranged on the rear surface of the base substrate 2 with a plurality of pin-shaped mounting terminals (or mounting pins) 23. These mounting terminals 23 are constructed to have the so-called "butt joint structure", in which their leading ends abut against the terminals on the surface of the module substrate 31 of the semiconductor module 30. In other words, the semiconductor device 1 adopting the MCC structure is mounted on the surface of the module substrate 31, a gap can be retained between the main surface of the module substrate 31 and the rear surface of the base substrate 2. This gap can absorb the stress, which is generated on the temperature cycle due to the difference between the thermal expansion coefficients of the module substrate 31 and the base substrate 2, to prevent the connection areas between the module substrate 31 and the base substrate 2 from being damaged or broken.

The semiconductor device 1 adopting the MCC structure thus constructed can absorb the stress, which is generated in the temperature cycle in the individual connection areas between the mounting terminals 23 of the butt joint structure on the rear surface of the base substrate 2 and the terminals of the mounting module substrate 31, with the mounting terminals 23 so that it can prevent the connection areas from being damaged or broken to elongate the lifetime of the connection areas.

Embodiment 4

According to the fourth embodiment 4, the arrangement of the testing terminals to be arrayed on the base substrate 2 is changed in the chip-carrier type semiconductor device 1 adopting the MCC structure.

Figure 15:
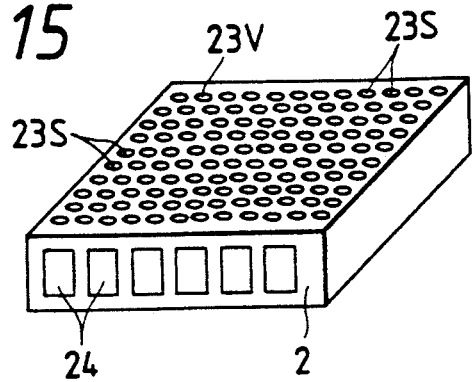
FIG. 15 is a perspective view showing a chip-carrier type semiconductor device adopting an MCC structure according to an embodiment 4 of the present invention.
Figure 16:
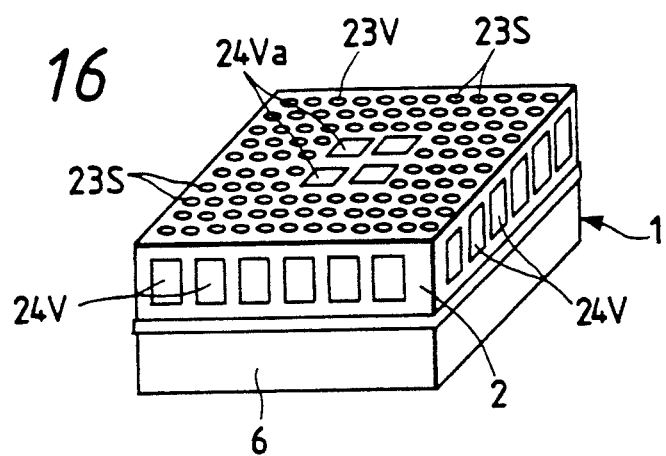
FIG. 16 is a perspective view showing another example of the semiconductor device.

The construction of the chip-carrier type semiconductor device adopting the MCC structure according to the embodiment 4 of the present invention is shown in FIGS. 15 and 16 (presenting perspective views).

In the semiconductor device 1 adopting the MCC structure according to the present embodiment 4, as shown in FIG. 15, only the partial ones of the four side surfaces of the base substrate 2 are arranged with the auxiliary terminals 24 (and/or 24S). The number of auxiliary terminals 24 to be arranged may be basically as many as required for the purpose.

Moreover, the semiconductor device 1 adopting the MCC structure according to the present embodiment 4 is arrayed, as shown in FIG. 16, with not only the power supplying test terminals 24V arranged on the side surfaces of the base substrate 2 but also second auxiliary terminals or power supplying test terminals 24Va on the rear surface of the base substrate 2. These power supplying test terminals 24Va are arranged in the central area of the rear surface of the base substrate 2 such that they are given a size larger than that of the mounting terminals 23 arrayed on the rear surface of the base substrate 2 and are electrically connected with the power supplying metallized wirings 21V. In other words, the mesh-shaped power supplying metallized wirings 21V, which are wired substantially all over the area in the base substrate 2, are supplied with the individual powers from the sides of the base substrate 2 through the power supplying test terminals 24V and from the central area of the rear surface of the base substrate 2 through the power supplying test terminals 24Va.

The semiconductor device 1 adopting the MCC structure thus constructed can supply the powers individually from the sides of the base substrate 2 and the central area of the rear surface at the aforementioned burn-in for the screening so that it can feed the semiconductor pellet 3 uniformly with the currents individually from the power supplying test terminals 24V and 24Va of the base substrate 2. As a result, it is possible to reduce the phenomenon (or to suppress the supply voltage drop) that a high current flows locally in the peripheral area of the base substrate 2 due to the parasitic resistance of the power supplying metallized wirings 21V, thereby to prevent the good semiconductor device 1 adopting the MCC structure from being broken due to the burn-in.

Embodiment 5

According to the present embodiment 5, capacity elements are installed in the semiconductor device adopting the MCC structure by making use of the testing terminals arrayed on the side surfaces of the base substrate.

Figure 17:
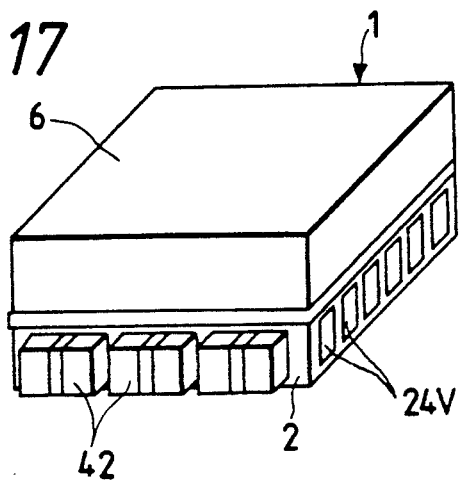
FIG. 17 is a perspective view showing a chip-carrier type semiconductor device adopting an MCC structure according to an embodiment 5 of the present invention.

The construction of the semiconductor device adopting the MCC structure according to the embodiment 5 of the present invention is shown in FIG. 17 (presenting a perspective view).

In the chip-carrier type semiconductor device 1 adopting the MCC structure according to the present embodiment 5, as shown in FIG. 17, capacity elements (e.g., smoothing capacitors) 42 are installed by connecting them with the power supplying test terminals 24V arrayed on the sides of the base substrate 2. The capacity elements 42 have their first electrodes or one-side electrodes connected electrically with the power supplying test terminals 24V1 of one (e.g., the power supply V1) of the plurality of kinds of power sources and their second electrodes or other electrodes connected electrically with the power supplying test terminals 24V2 of another (e.g., the power supply V2). In this case, the capacity elements 42 can absorb the power noises which are generated in either the power source V1 or V2.

Thus, in the semiconductor device 1 adopting the MCC structure, the capacity elements 42 are installed by connecting them with the power supplying test terminals 24V arranged on the sides of the base substrate 2. Thanks to this construction, the absorptivity of the power noises to be generated in either of the two kinds of power sources in the semiconductor device 1 adopting the MCC structure can be enhanced to improve the operational reliability of the circuit system mounted on the semiconductor pellet 3.

Although our invention has been specifically described on the basis of the foregoing embodiments, it should not be limited thereto but can naturally be modified in various manners without departing from the gist thereof.

For example, the present invention should not be limited to the semiconductor device 1 adopting the MCC structure, in which one semiconductor pellet 3 is mounted on the main surface of the base substrate 2, but could be modified such that a plurality of semiconductor pellets 3 are mounted on the main surface of one base substrate 2.

According to the present invention, on the other hand, the aforementioned semiconductor device 1 adopting the MCC structure could be modified such that the power supplying metallized wirings 21V are formed on a portion of the whole area of one internal wiring layer of the base substrate 2.

According to the present invention, on the other hand, the aforementioned semiconductor device 1 adopting the MCC structure could be modified such that two kinds (e.g., the power sources V1 and V2) of power supplying metallized wirings 21V are formed in one internal wiring layer of the base substrate 2.

According to the present invention, on the other hand, in the semiconductor device adopting the PGA (i.e., Pin Grid Array) structure, in which the semiconductor pellet is mounted on the surface of the ceramic substrate (or base substrate) whereas the mounting pins are arrayed on the rear surface, the testing terminals may be arrayed on the sides of the aforementioned ceramic substrate. The semiconductor device adopting this PGA structure should not be limited to the ceramic substrate but may be a resin substrate.

According to the present invention, on the other hand, the testing terminals may be arrayed on the sides of the wiring substrate mounting a plurality of semiconductor devices, such as the module substrates of the semiconductor module.

The effects to be obtained from the representatives of the invention disclosed herein will be briefly described in the following.

(1) The semiconductor device, in which the semiconductor pellet is mounted on the surface of the substrate whereas the mounting terminals to be connected with the external terminals of the semiconductor pellet are mounted on the rear surface of the substrate, can be subjected to a test such as the screening while coping with the multiplication and miniaturization of the aforementioned mounting terminals.

(2) In addition to the aforementioned effect (1), the aforementioned semiconductor device can have its mounting terminals multiplied independently of the test such as the screening.

(3) In addition to the aforementioned effect (2), the aforementioned semiconductor device can be smallsized.

(4) In addition to the aforementioned effect (1), the test such as the screening of the aforementioned semiconductor device can improve the reliability of the result of selecting the good and defective products and ensure the selections.

(5) In addition to the aforementioned effect (1), the aforementioned semiconductor device can improve the workability in the test such as the screening.

(6) In addition to the aforementioned effect (1), the aforementioned semiconductor device can improve the performance in the test such as the screening or the ordinary circuit operation.

(7) In addition to the aforementioned effect (6), the aforementioned semiconductor device can reduce occurrence of defects.

(8) A device, in which a plurality of semiconductor devices each having a semiconductor pellet mounted on the surface of a substrate and mounting terminals mounted on the rear surface of the substrate and connected with the external terminals of the aforementioned semiconductor pellet are sealed in a module substrate, can be tested or screened such that the semiconductor device are mounted in the aforementioned module substrate.

What is claimed is:

1. A semiconductor device comprising:
    a base substrate having a first surface, a second surface opposite to said first surface, and a third surface formed between said first surface and said second surface, said first surface having a plurality of connection terminals, and said second surface having a plurality of mounting terminals connected electrically with said connection terminals, said connection terminals and said mounting terminals having at least one power supplying terminal connected electrically with each other;
    a semiconductor pellet having a principal surface having a circuit element and a plurality of external terminals, and a rear surface opposite to said principal surface, said external terminals having at least one power supplying external terminal, said semiconductor pellet being mounted on said base substrate such that the first surface of said base substrate faces the principal surface of said semiconductor pellet, said external terminals being electrically connected with the connection terminals of said base substrate; and
    a first auxiliary terminal mounted on the third surface of said base substrate, said first auxiliary terminal being electrically connected with said power supplying external terminal which electrically connects at least one of said connection terminals with at least one of said mounting terminals.

2. A semiconductor device according to claim 1, wherein said circuit element comprises MISFETs and/or bipolar transistors.

3. A semiconductor device according to claim 1, wherein said circuit element comprises complementary MISFETs.

4. A semiconductor device according to claim 1, wherein said first auxiliary terminal is for connecting to a burn-in voltage source.

5. A semiconductor device according to claim 1, wherein the first auxiliary terminal has an area larger than that of any of said mounting terminals.

6. A semiconductor device according to claim 1, further comprising:
    a second auxiliary terminal mounted on said second surface and connected electrically with said power supplying external terminal,
    wherein said second auxiliary terminal has an area larger than that of any of said mounting terminals.

7. A semiconductor device according to claim 1, wherein said base substrate includes a plurality of sheet-shaped substrates each having a metallized wiring layer on its one surface, and wherein said metallized layer is formed into a mesh shape substantially all over said sheet-shaped substrates.

8. A semiconductor device according to claim 1, further comprising:
    a cap having a cavity connected to said base substrate to shroud and seal said semiconductor pellet in said cavity.

9. A semiconductor device according to claim 1, further comprising: a capacity element mounted on the third surface of said base substrate and having a first electrode and a second electrode,
    wherein said first auxiliary terminal formed on the third surface of said base substrate includes two power supply terminals adapted to be individually supplied with at least two kinds of powers, and
    wherein said first electrode is electrically connected with one of said power supply terminals whereas said second electrode is electrically connected with the other power supply terminal.

10. A semiconductor device according to claim 1, further comprising:
    means for connecting the external terminals of said semiconductor pellet and the connection terminals of said base substrate electrically.

11. A semiconductor device according to claim 10, wherein said connecting means is a solder bump.

12. A semiconductor device according to claim 10, wherein said connecting means is a TAB lead.

13. A semiconductor module comprising:
    a plurality of semiconductor devices each comprising: a base substrate having a first surface, a second surface opposite to said first surface, and a third surface formed between said first surface and said second surface, said first surface having a plurality of first connection terminals, and said second surface having a plurality of first mounting terminals connected electrically with said first connection terminals, said first connection terminals and said first mounting terminals having at least one power supplying terminal connected electrically with each other; and a semiconductor pellet having a principal surface having a circuit element and a plurality of external terminals, and a rear surface opposite to said principal surface, said external terminals having at least one power supplying external terminal, said semiconductor pellet being mounted on said base substrate such that the first surface of said base substrate faces the principal surface of said semiconductor pellet, said external terminals being electrically connected with said first connection terminals of said base substrate; and a first auxiliary terminal mounted on the third surface of said base substrate, said first auxiliary terminal being electrically connected with said power supplying external terminal which electrically connects at least one of said connection terminals with at least one of said mounting terminals; and
    a module substrate having a principal surface having a plurality of second connection terminals and a rear surface having a plurality of second mounting terminals, said plurality of semiconductor devices being mounted on the principal surface of said module substrate, and said second connection terminals and said second mounting terminals being electrically connected with each other.

14. A semiconductor device according to claim 13, wherein said circuit element comprises MISFETs and/or bipolar transistors.

15. A semiconductor device according to claim 13, wherein said circuit element comprises complementary MISFETs.

16. A semiconductor device according to claim 13, wherein said first auxiliary terminal is for connecting to a burn-in voltage source.

17. A semiconductor module according to claim 13, further comprising:
a module cap having a cavity connected to said module substrate to shroud and seal said plurality of semiconductor devices in said cavity.

18. A semiconductor module according to claim 13, wherein said first auxiliary terminal has an area larger than that of any of said mounting terminals.

19. A semiconductor module according to claim 13, further comprising:
a second auxiliary terminal mounted on said second surface and connected electrically with said power supplying external terminal,
wherein said second auxiliary terminal has an area larger than that of any of said mounting terminals.

20. A semiconductor module according to claim 13, wherein said base substrate includes a plurality of sheet-shaped substrates each having a metallized wiring layer on its one surface, and wherein said metallized layer is formed into a mesh shape substantially all over said sheet-shaped substrates.

21. A semiconductor module according to claim 13, further comprising:
a cap having a cavity connected to said base substrate to shroud and seal said semiconductor pellet in said cavity.

22. A semiconductor module according to claim 13, further comprising: a capacity element mounted on the third surface of said base substrate and having a first electrode and a second electrode,
wherein said first auxiliary terminal formed on the third surface of said base substrate includes two power supply terminals adapted to be individually supplied with at least two kinds of powers, and
wherein said first electrode is electrically connected with one of said power supply terminals whereas said second electrode is electrically connected with the other power supply terminal.

23. A semiconductor module according to claim 13, further comprising:
means for connecting the external terminals of said semiconductor pellet and the connection terminals of said base substrate electrically.

24. A semiconductor module according to claim 23, wherein said connecting means is a solder bump.

25. A semiconductor module according to claim 23, wherein said connecting means is a TAB lead.

* * * * *